(12) United States Patent
Weng et al.

(10) Patent No.: US 10,991,873 B2
(45) Date of Patent: Apr. 27, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chen-Yi Weng, New Taipei (TW); Jing-Yin Jhang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 32 days.

(21) Appl. No.: 16/166,173

(22) Filed: Oct. 22, 2018

(65) Prior Publication Data

US 2020/0083428 A1   Mar. 12, 2020

(30) Foreign Application Priority Data

Sep. 7, 2018 (CN) .......................... 201811044897.2

(51) Int. Cl.

| | |
|---|---|
| *H01L 43/02* | (2006.01) |
| *H01L 43/12* | (2006.01) |
| *H01F 10/32* | (2006.01) |
| *H01F 41/34* | (2006.01) |
| *H01L 23/528* | (2006.01) |
| *H01L 21/768* | (2006.01) |
| *H01L 27/22* | (2006.01) |
| *H01L 23/522* | (2006.01) |
| *H01L 43/10* | (2006.01) |

(52) U.S. Cl.
CPC ......... *H01L 43/02* (2013.01); *H01F 10/3254* (2013.01); *H01F 41/34* (2013.01); *H01L 21/7684* (2013.01); *H01L 21/76802* (2013.01); *H01L 21/76877* (2013.01); *H01L 23/528* (2013.01); *H01L 23/5226* (2013.01); *H01L 27/222* (2013.01); *H01L 43/12* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 9,362,490 B1 | 6/2016 | Xiao | |
| 9,704,919 B1 | 7/2017 | Lu et al. | |
| 2008/0140922 A1* | 6/2008 | Higo | B82Y 25/00 711/105 |
| 2017/0047374 A1* | 2/2017 | Lu | H01L 23/5226 |
| 2017/0092693 A1* | 3/2017 | Tan | H01L 43/08 |
| 2018/0197914 A1* | 7/2018 | Jeong | H01L 23/528 |

* cited by examiner

*Primary Examiner* — Steven M Christopher
(74) *Attorney, Agent, or Firm* — Winston Hsu

(57) ABSTRACT

A method for fabricating semiconductor device includes the steps of: forming a magnetic tunneling junction (MTJ) on a substrate; forming a liner on the MTJ; removing part of the liner to form a recess exposing the MTJ; and forming a conductive layer in the recess, wherein top surfaces of the conductive layer and the liner are coplanar. Preferably the MTJ further includes: a bottom electrode on the substrate, a fixed layer on the bottom electrode, and a top electrode on the fixed layer, in which the conductive layer and the top electrode are made of same material.

11 Claims, 7 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a magnetic tunneling junction (MTJ) on a substrate; forming a liner on the MTJ; removing part of the liner to form a recess exposing the MTJ; and forming a conductive layer in the recess, wherein top surfaces of the conductive layer and the liner are coplanar. Preferably the MTJ further includes: a bottom electrode on the substrate, a fixed layer on the bottom electrode, and a top electrode on the fixed layer, in which the conductive layer and the top electrode are made of same material.

According to another aspect of the present invention, a semiconductor device includes: a magnetic tunneling junction (MTJ) on a substrate, wherein the MTJ comprises, a bottom electrode, a fixed layer, and a top electrode, in which the top electrode comprises a T-shape. The semiconductor device further includes a first inter-metal dielectric (IMD) layer on the substrate; a first metal interconnection in the first IMD layer; the MTJ on the first metal interconnection; a second IMD layer on the first IMD layer and around the MTJ; and a liner on the second IMD layer and around the MTJ. Preferably, the top electrode of the MTJ includes a bottom portion in the second IMD layer and a top portion in the liner.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
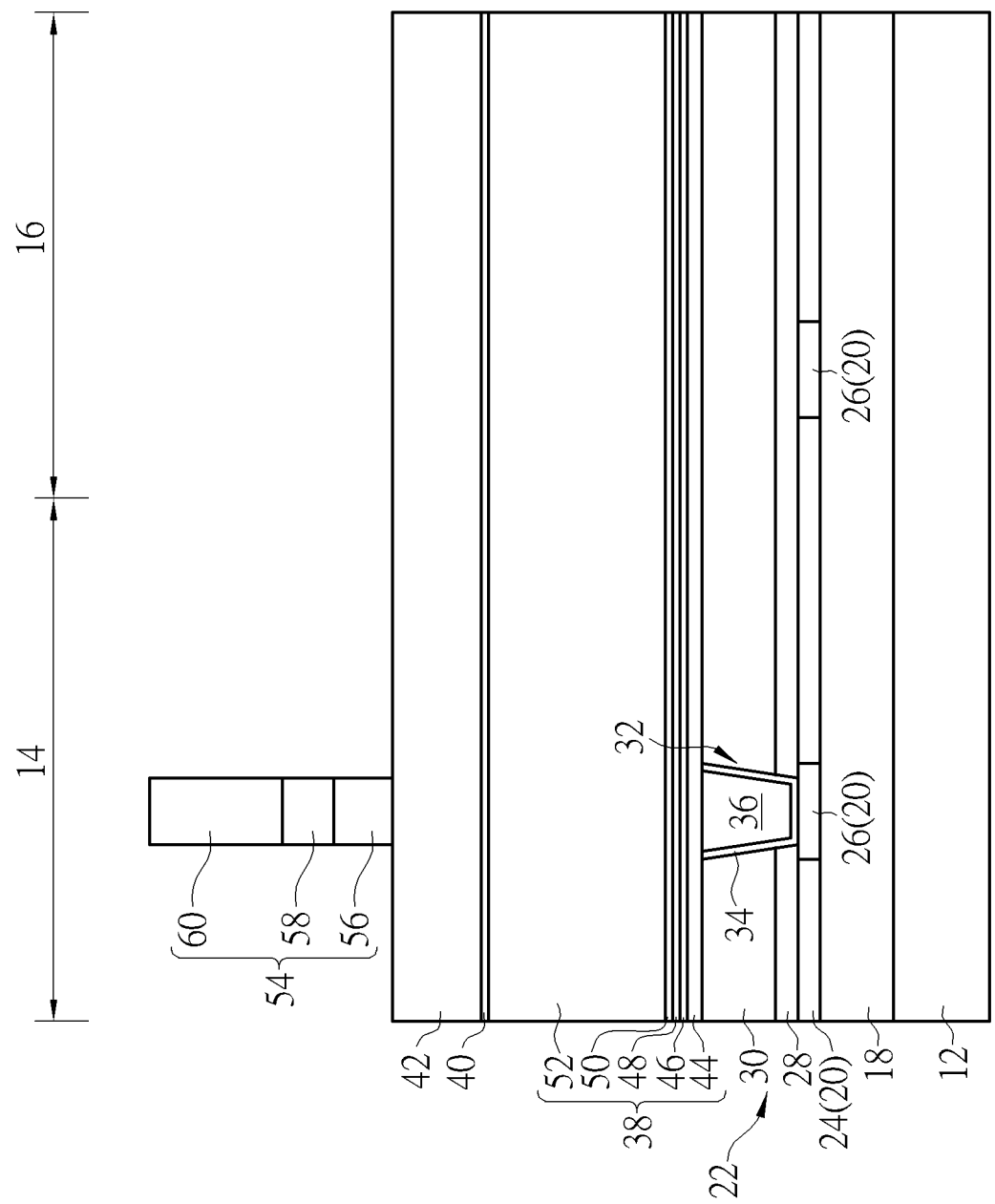
FIGS. 1-7 illustrate a method for fabricating a semiconductor device according to an embodiment of the present invention.

Referring to FIGS. 1-7, FIGS. 1-7 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region 80, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a free layer 48, a capping layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field. The capping layer 50 could be made of insulating material including but not limited to for example oxides such as aluminum oxide (AlO$_x$) or magnesium oxide (MgO). Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
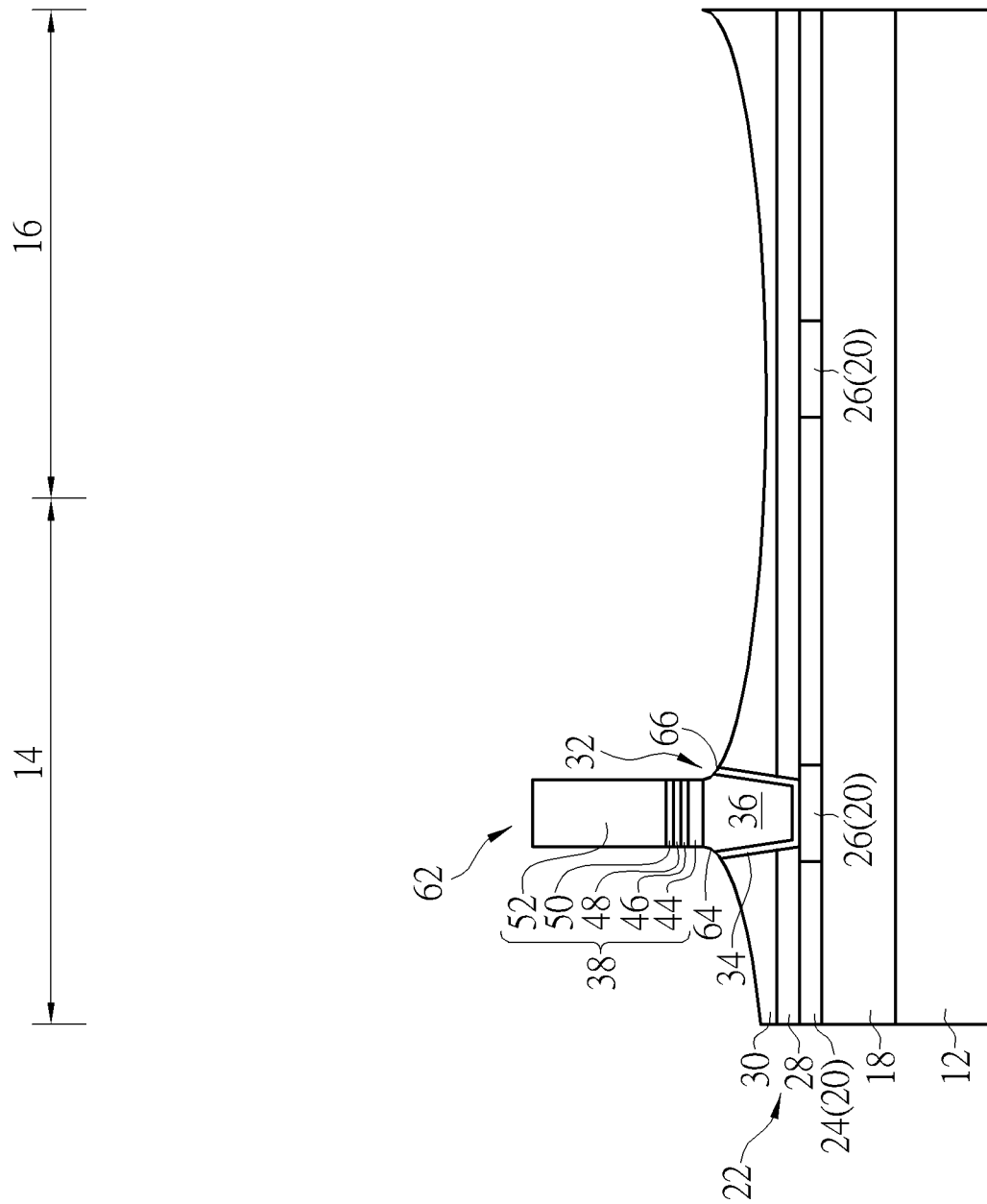

Next, as shown in FIG. 2, one or more etching process is conducted by using the patterned mask 54 as mask to remove part of the cap layers 40, 42, part of the MTJ stack 38, and part of the IMD layer 30 to form a MTJ 62 on the MTJ region 14, in which the first electrode layer 44 at this stage preferably becomes a bottom electrode 76 for the MTJ 62 while the second electrode layer 52 becomes a top electrode 78 for the MTJ 62 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJ 62. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Figure 3:
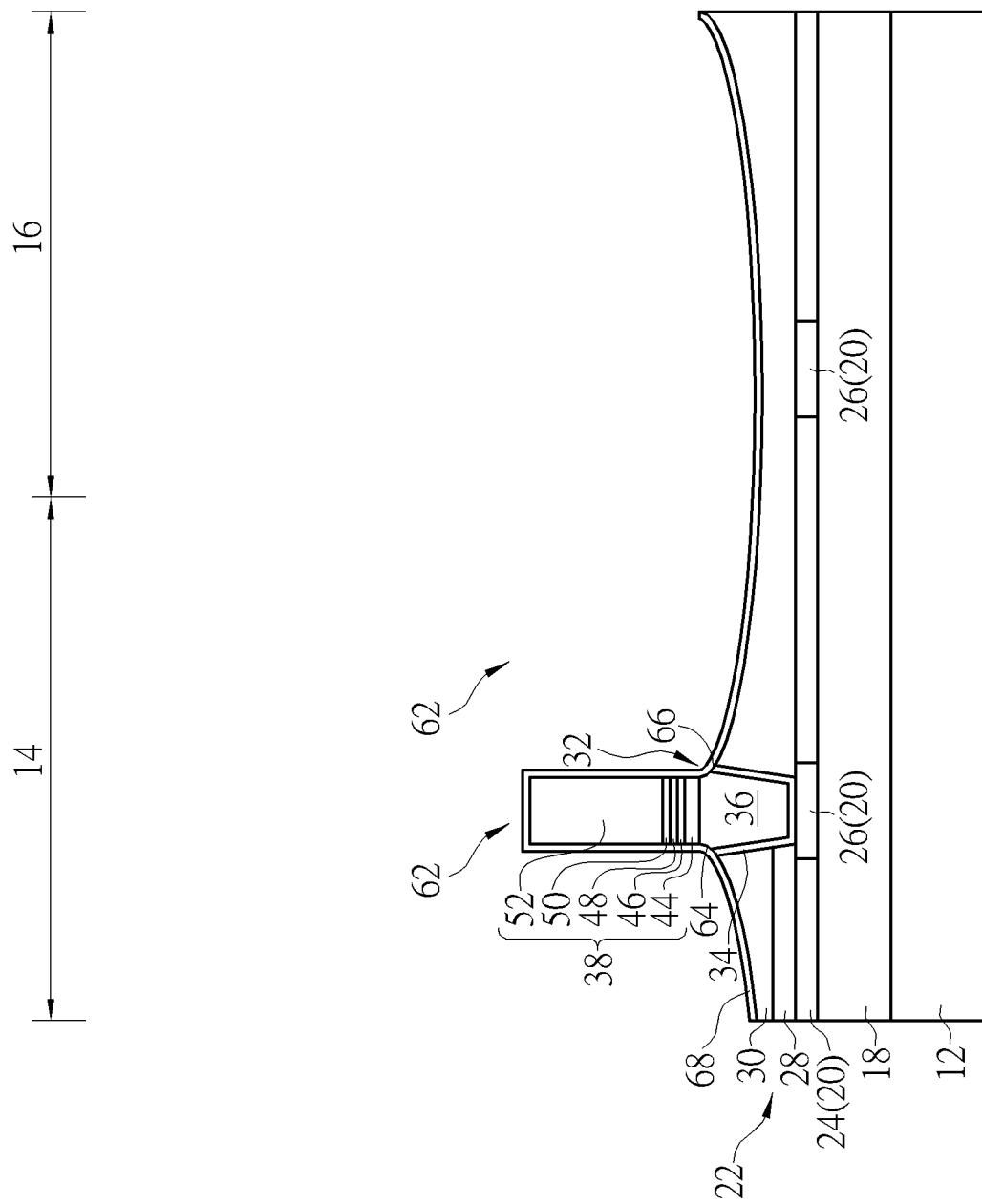

Next, as shown in FIG. 3, a liner 68 is formed on the MTJ 62 to cover the surface of the IMD layer 30. In this embodiment, the liner 68 is preferably made of silicon oxide, but could also be made of other dielectric material including but not limited to for example silicon oxide, silicon oxynitride, or silicon carbon nitride.

Figure 4:
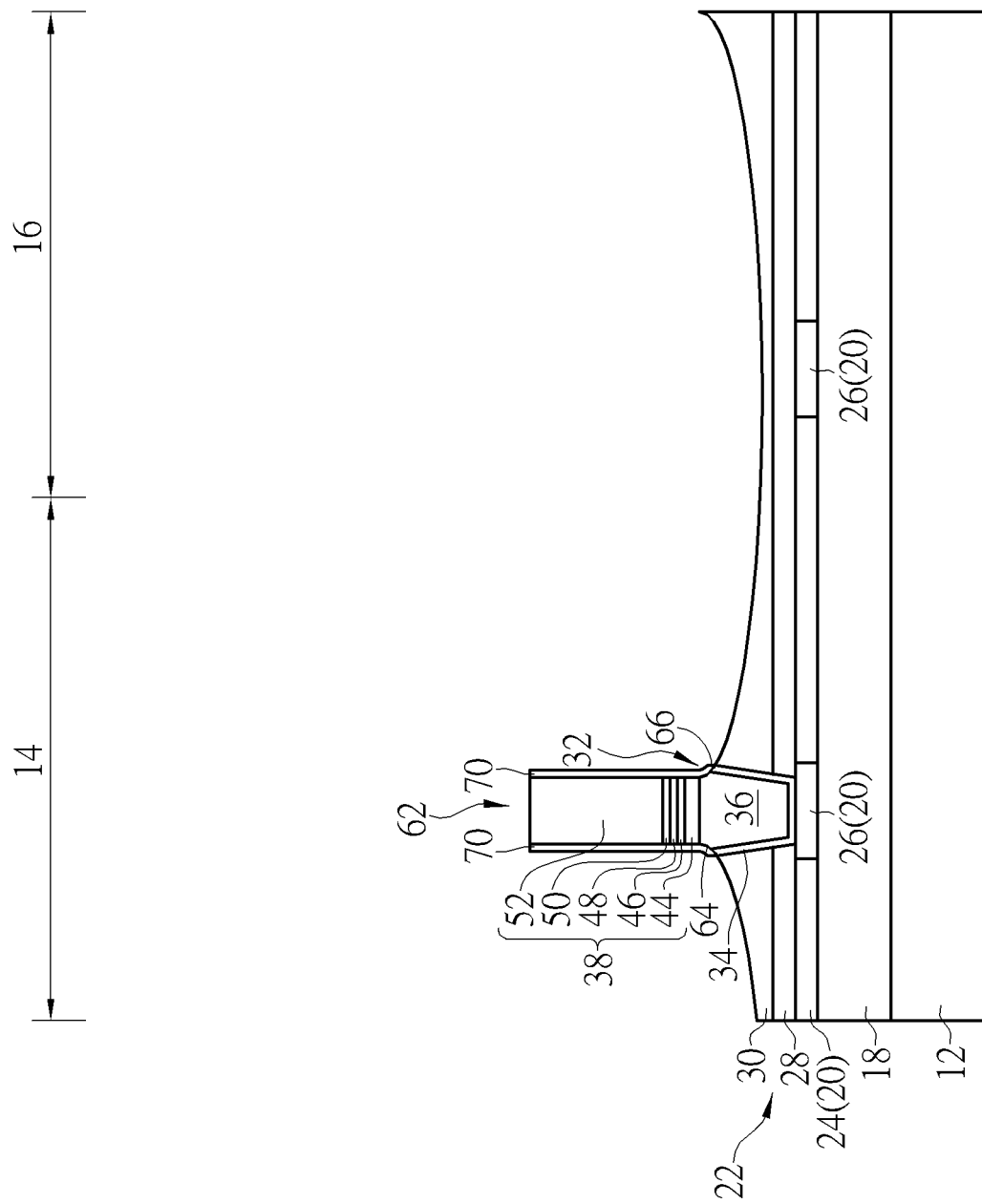

Next, as shown in FIG. 4, an etching process is conducted to remove part of the liner 68 to form a spacer 70 adjacent to each of the MTJ 62, in which the spacer 70 is disposed on the sidewalls of each of the MTJ 62 and at the same time covering and contacting the first slanted sidewalls 64 and second slanted sidewalls 66 of the metal interconnections 32 directly.

Figure 5:
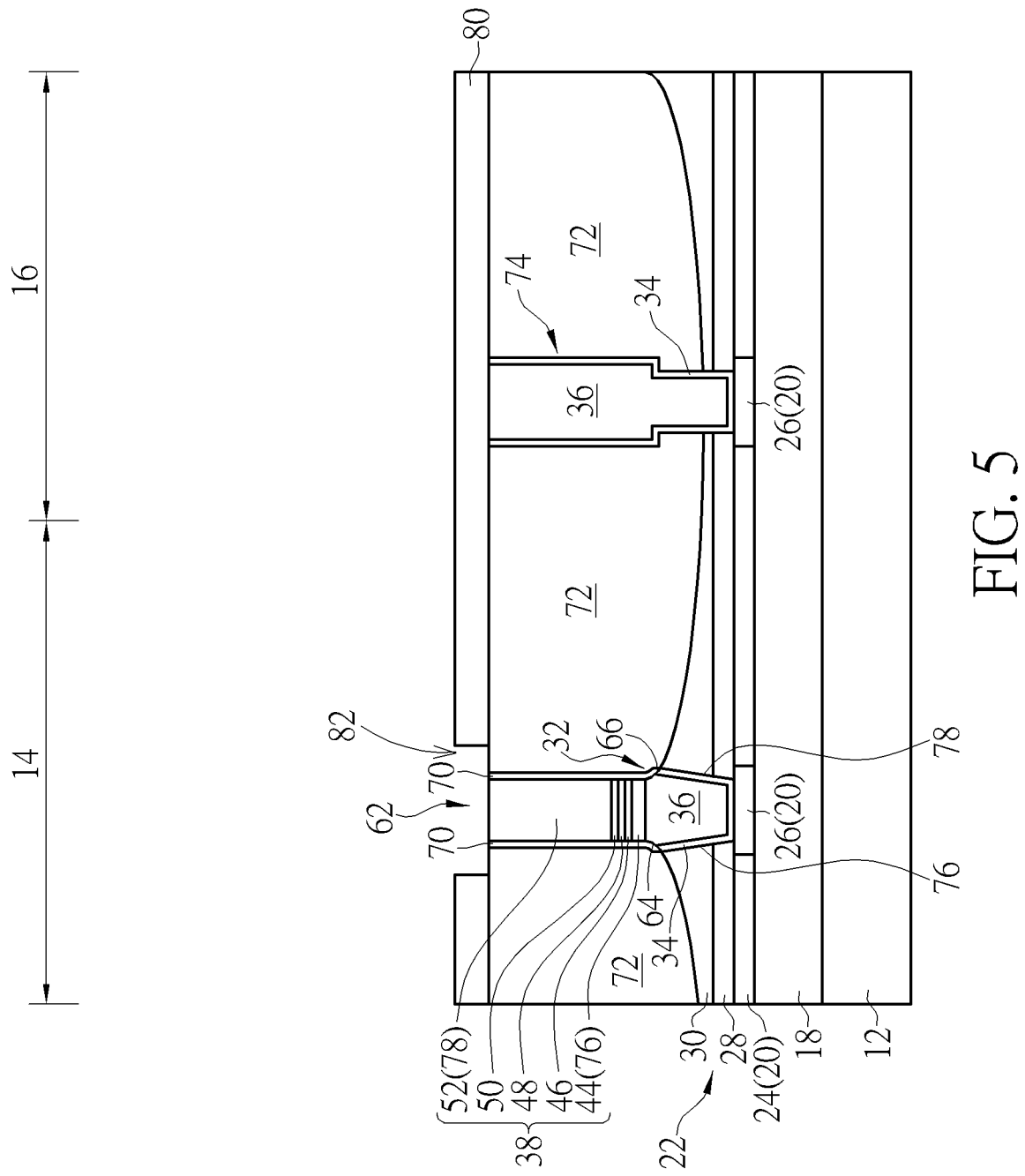

Next, as shown in FIG. 5, another IMD layer 72 is formed on the MTJ region 14 and logic region 16, and a planarizing process such as CMP is conducted to remove part of the IMD layer 72 so that the top surface of the IMD layer 72 is even with the top surface of the MTJ 62. Next, a pattern transfer process is conducted by using a patterned mask (not shown) to remove part of the IMD layer 72 on the logic region 16 to form a contact hole (not shown) exposing the metal interconnection 26 underneath and metals are deposited into the contact hole afterwards. For instance, a barrier layer 34 selected from the group consisting of titanium (Ti), titanium nitride (TiN), tantalum (Ta), and tantalum nitride (TaN) and metal layer 36 selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the metals including the aforementioned barrier layer and metal layer to form a contact plug in the contact hole electrically connecting the metal interconnection 26.

Next, a liner 80 is formed on the MTJ 62 to cover the surface of the IMD layer 72, and a photo-etching process is conducted to remove part of the liner 80 to form a recess 82 exposing the MTJ 62. It should be noted that the width of the recess 82 formed at this stage is preferably greater than the width of the MTJ 62 so that the recess 82 preferably exposes the MTJ 62, the spacer 70, and part of the IMD layer 72 surrounding the MTJ 62. In this embodiment, the liner 80 and the stop layer 28 could be made of same material or different materials while both elements could include nitrogen doped carbide (NDC), silicon nitride, silicon carbon nitride (SiCN), or combination thereof.

Figure 6:
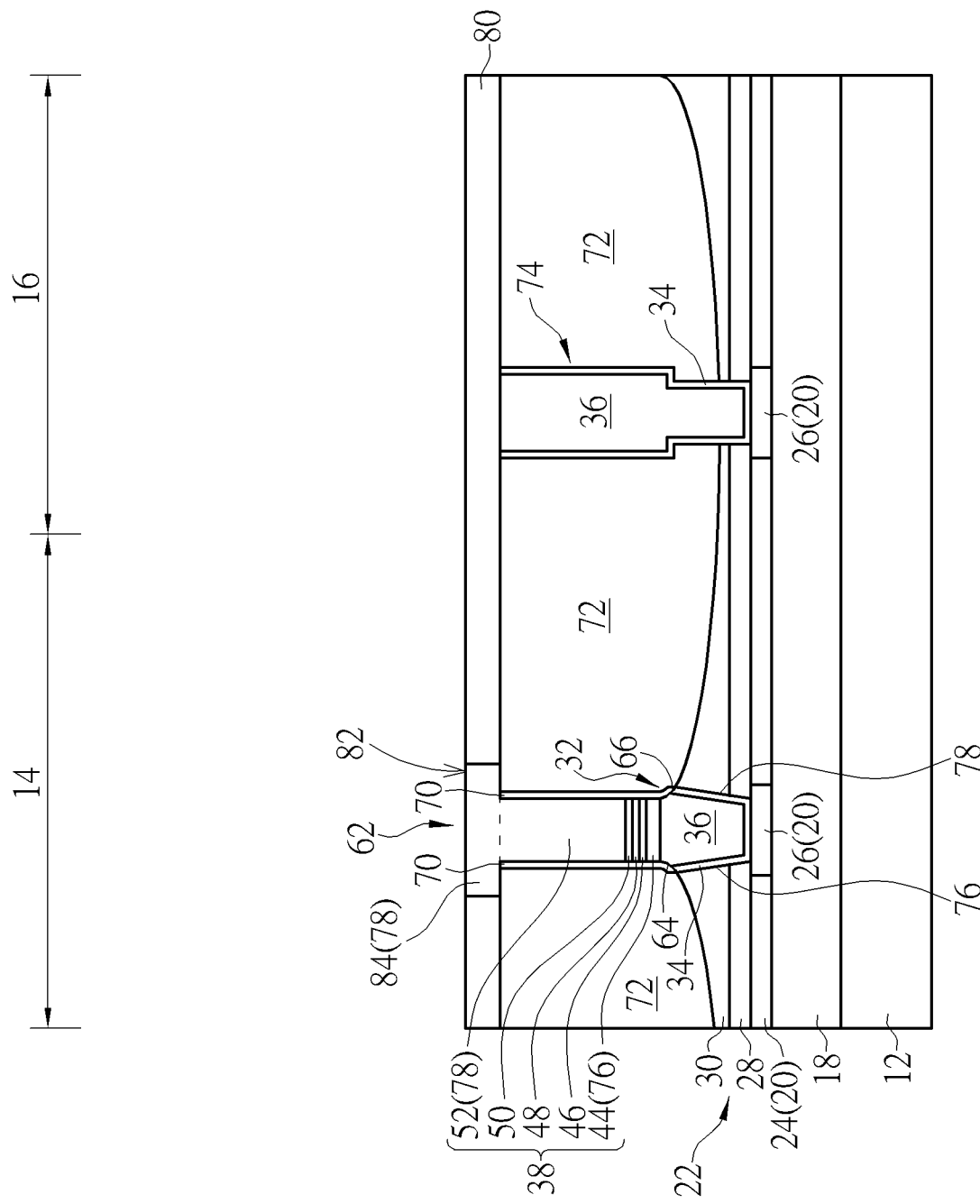

Next, as shown in FIG. 6, a conductive layer 84 is formed on the surface of the liner 80 to fill the recess 84 completely, and a planarizing process such as CMP is conducted to remove part of the conductive layer 84 so that the top surface of the remaining conductive layer 84 is even with the top surface of the liner 80. It should be noted that the conductive layer 84 and the top electrode 78 or the aforementioned second electrode layer 52 of the MTJ 62 are preferably made of same material such as but not limited to for example Ta or TiN, so that the remaining conductive layer 84 embedded in the liner 80 and the top electrode of MTJ 62 underneath after the planarizing process would form a new top electrode 78 altogether.

Figure 7:
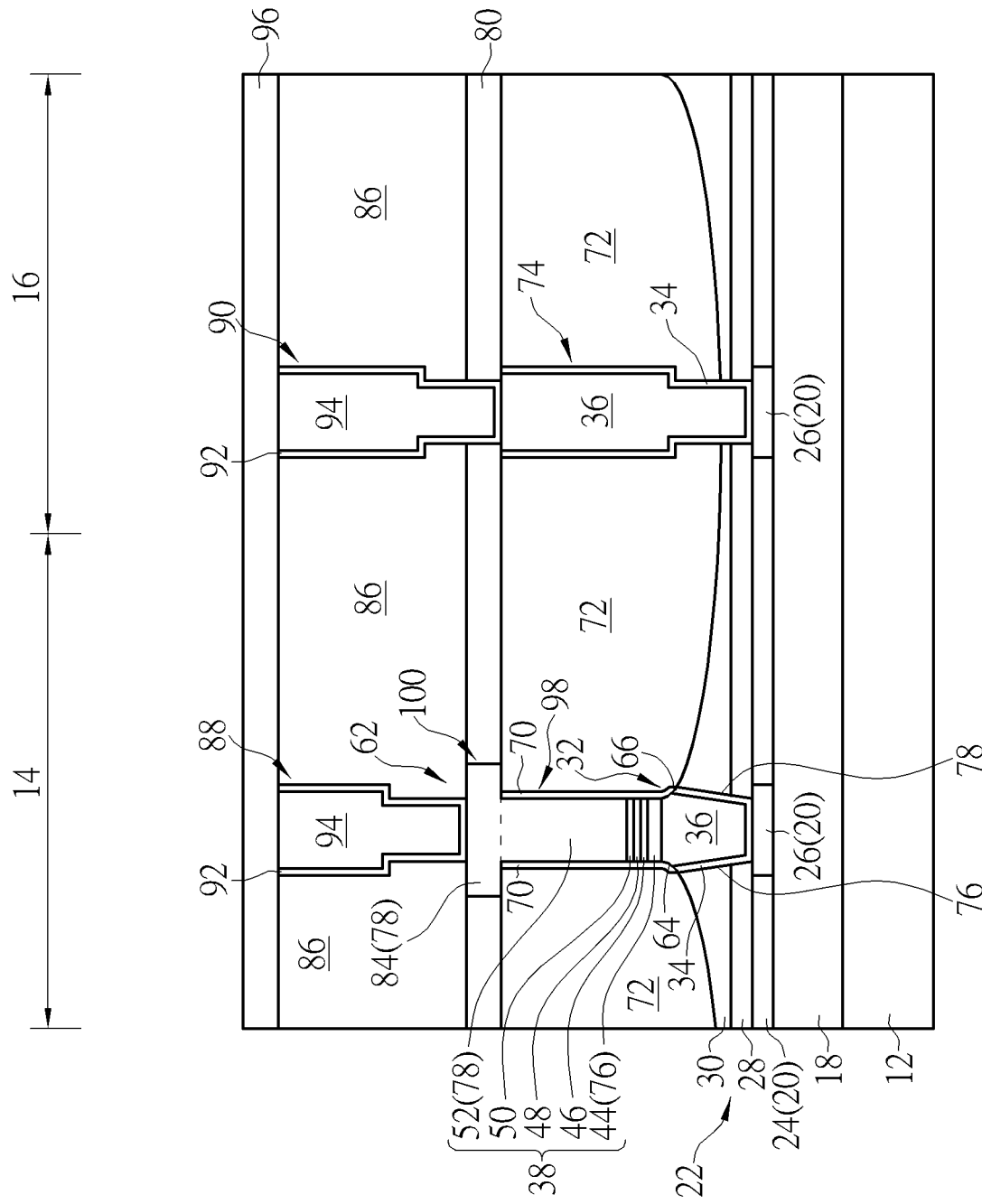

Next, as shown in FIG. 7, another IMD layer 86 is formed on the liner 80 to cover the conductive layer 84, metal interconnections 88, 90 are formed on the MTJ region 14 and logic region 16 respectively to electrically connect the MTJ 62 and contact plug 74 underneath, and another stop layer 96 is formed on the IMD layer 86 to cover the metal interconnections 88, 90, in which the metal interconnection 88 on the MTJ region 14 directly contacts the MTJ 62 underneath while the metal interconnection 90 on the logic region 16 directly contacts the lower level contact plug 74.

Similar to the metal interconnections disclosed above, each of the metal interconnections 88, 90 could be embedded within the IMD layer 86 according to a single damascene process or dual damascene process. For instance, each of the metal interconnections 88, 90 could further includes a barrier layer 92 and a metal layer 94, in which the barrier layer 92 could be selected from the group consisting of titanium (Ti), titanium nitride (TiN), tantalum (Ta), and tantalum nitride (TaN) and the metal layer 94 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring again to FIG. 7, FIG. 7 illustrates a structural view of a semiconductor device according to an embodiment of the present invention. As shown in FIG. 7, the semiconductor device preferably includes a MTJ 62 on the MTJ region 14 on a substrate 12, a metal interconnection 74 disposed on the logic region 16 adjacent to the MTJ 62, an IMD layer 72 around the MTJ 62 and the metal interconnection 74, a metal interconnection 32 connected and directly contacting the bottom of the MTJ 62, a metal interconnection 88 connected and directly contacting the top of the MTJ 62, a metal interconnection 90 connected and directly contacting the metal interconnection 74, an IMD layer 86 surrounding the metal interconnections 88, 90, and a liner 80 between the IMD layers 72 and 86 and around part of the MTJ 62.

In this embodiment, the MTJ 62 preferably includes a bottom electrode 76, a fixed layer 46, a free layer 48, a capping layer 50, and a top electrode 78, in which the top electrode 78 includes a T-shape cross-section. Specifically, the T-shape cross-section of the top electrode 78 further includes a bottom portion 98 in the IMD layer 72 and a top portion 100 in the liner 80, in which the width of the bottom portion 98 is preferably less than the width of the top portion 100, the top surface of the bottom portion 98 is even with the top surface of the IMD layer 72, the top surface of the top portion 100 is even with the top surface of the liner 80, and both the bottom portion 98 and the top portion 100 are preferably made of same material or even same metal material including but not limited to for example Ta or TiN. The semiconductor device further includes a spacer 70 disposed adjacent to or on sidewalls of the bottom electrode 76, fixed layer 46, free layer 48, capping layer 50, and top electrode 78, in which the top surface of the spacer 70 is even with the top surface of the bottom portion 98 or lower than the top surface of the entire top electrode 78.

Overall, the present invention first forms MTJ on the substrate, forms a liner or stop layer covering the MTJ and the IMD layer surrounding the MTJ, removes part of the liner to form a recess exposing the MTJ, and then fills a conductive layer in the recess so that the conductive layer and the original top electrode of the MTJ forms a new top electrode, in which the newly formed top electrode preferably includes a T-shaped cross-section. By following this design, the present invention could expand the area of the top electrode of the MTJ to prevent tiger tooth structure or damages done to the MTJ during metal interconnective process conducted afterwards.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a first inter-metal dielectric (IMD) layer on a substrate;
    a first metal interconnection in the first IMD layer;
    a magnetic tunneling junction (MTJ) on the first metal interconnection, wherein the MTJ comprises:
        a bottom electrode;
        a fixed layer; and
        a top electrode, comprising:
            a bottom portion on the MTJ, wherein a sidewall of the bottom portion is aligned with a sidewall of the MTJ; and
            a top portion on the bottom portion, wherein a width of a top surface of the bottom portion is less than a width of a top surface of the top portion and the top surface of the bottom portion contacts a bottom surface of the top portion directly;
    a second IMD layer on the first IMD layer and around the MTJ; and
    a liner on the second IMD layer and around the top portion of the top electrode, wherein a top surface of the top portion is even with a top surface of the liner.

2. The semiconductor device of claim 1, further comprising a second metal interconnection in the second IMD layer and adjacent to the MTJ.

3. The semiconductor device of claim 2, wherein top surfaces of the second metal interconnection and the second IMD layer are coplanar.

4. The semiconductor device of claim 1, wherein the MTJ comprises:
    the bottom electrode on the first metal interconnection;
    the fixed layer on the bottom electrode; and
    the top electrode on the fixed layer.

5. The semiconductor device of claim 4, wherein the top electrode comprises:
    the bottom portion in the second IMD layer; and
    the top portion in the liner.

6. The semiconductor device of claim 5, wherein a width of the bottom portion is less than a width of the top portion.

7. The semiconductor device of claim 5, wherein top surfaces of the bottom portion and the second IMD layer are coplanar.

8. The semiconductor device of claim 5, wherein the bottom portion and the top portion comprise a same material.

9. The semiconductor device of claim 5, further comprising a spacer adjacent to the bottom electrode, the fixed layer, and the bottom portion.

10. The semiconductor device of claim 9, wherein top surfaces of the spacer and the bottom portion are coplanar.

11. A semiconductor device, comprising:
    a magnetic tunneling junction (MTJ) on a substrate, wherein the MTJ comprises:
        a bottom electrode;

a fixed layer;
a top electrode, comprising:
   a bottom portion on the MTJ, wherein a sidewalls of the bottom portion is aligned with a sidewall of the MTJ; and
   a top portion on the bottom portion; and
a spacer adjacent to and directly contacting a sidewall of the bottom electrode, the fixed layer, and a vertical sidewall of the bottom portion, wherein a top surface of the spacer is even with a top surface of the bottom portion of the top electrode.

* * * * *